United States Patent
Sung

(10) Patent No.: US 7,439,147 B2
(45) Date of Patent: Oct. 21, 2008

(54) RESISTOR OF SEMICONDUCTOR DEVICE AND METHOD FOR FABRICATING THE SAME

(75) Inventor: Woong Je Sung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 52 days.

(21) Appl. No.: 11/611,174

(22) Filed: Dec. 15, 2006

(65) Prior Publication Data

US 2007/0152302 A1    Jul. 5, 2007

(30) Foreign Application Priority Data

Dec. 29, 2005   (KR) .................. 10-2005-0134449

(51) Int. Cl.
*H01L 29/00* (2006.01)

(52) U.S. Cl. .................. 438/382; 257/536; 257/537; 257/380; 257/E21.004; 257/E27.047; 438/384; 438/385

(58) Field of Classification Search .................. 438/382, 438/200; 257/536, 537, 359, 538, 380, 363, 257/E27.047, 581
See application file for complete search history.

(56) References Cited

U.S. PATENT DOCUMENTS

2006/0049912 A1 *   3/2006   Grudin et al. ............... 338/195

* cited by examiner

*Primary Examiner*—Minh-Loan Tran
*Assistant Examiner*—Selim Ahmed
(74) *Attorney, Agent, or Firm*—Saliwanchik, Lloyd & Saliwanchik

(57) ABSTRACT

A resistor for a semiconductor device is provided. The resistor can include a first polysilicon layer formed on a semiconductor substrate; an insulating layer formed on regions of the first polysilicon layer; a second polysilicon layer formed on the insulating layer; and a contact electrically connected to the first polysilicon layer and the second polysilicon layer. The portions of the first polysilicon layer that do not have the insulating layer formed thereupon have a higher impurity ion concentration than that of the regions on which the insulating layer is formed.

5 Claims, 3 Drawing Sheets

RESISTOR OF SEMICONDUCTOR DEVICE AND METHOD FOR FABRICATING THE SAME

RELATED APPLICATION(S)

This application claims the benefit under U.S.C. 35 §119(e) of Korean Patent Application Number 10-2005-0134449 filed Dec. 29, 2005, which is incorporated herein by reference in its entirety.

FIELD OF THE INVENTION

The present invention relates to a resistor of a semiconductor device, and more particularly, to a resistor of a semiconductor device and a method for fabricating the same.

BACKGROUND OF THE INVENTION

In general, resistors used in semiconductor devices are formed by depositing amorphous silicon or doped polysilicon on a substrate.

In addition, as semiconductor devices become highly integrated, a variety of studies are being carried out in order to reduce sizes of resistors.

BRIEF SUMMARY

Accordingly, the present invention is directed to a resistor for a semiconductor device and a method for fabricating the same that addresses and/or substantially obviates one or more problems, limitations, and/or disadvantages of the prior art.

An object of the present invention is to provide a resistor of a reduced size.

To achieve these objects and other advantages and in accordance with the purpose of the invention, as embodied and broadly described herein, there is provided a resistor, including: a first polysilicon layer formed on a semiconductor substrate; an insulating layer formed on a region of the first polysilicon layer; a second polysilicon layer formed on the insulating layer; and a contact electrically connected to the first polysilicon layer and the second polysilicon layer, wherein in the first polysilicon layer, an impurity ion concentration of the remaining region of the first polysilicon layer that does not have an insulating layer formed thereupon is higher than that of the region on which the insulating layer is formed, In another aspect of the present invention, there is provided a resistor, including: a first polysilicon layer formed on a semiconductor substrate; a plurality of insulating layers formed on a plurality of regions of the first polysilicon layer; a plurality of second polysilicon layers formed on the plurality of insulating layers; and a plurality of contacts electrically connected to the first polysilicon layer and the plurality of the second polysilicon layers.

In yet another aspect of the present invention, there is provided a method for fabricating a resistor of a semiconductor device, the method including: forming a first polysilicon layer, an insulating layer, and a second polysilicon layer on a semiconductor substrate; patterning the insulating layer and the second polysilicon layer to expose a portion of the first polysilicon layer; implanting ions into the patterned second polysilicon layer and the exposed first polysilicon layer; and forming contacts on the exposed first polysilicon layer and the patterned second polysilicon layer for electrically connecting the first polysilicon layer and the second polysilicon layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 1A to 1E are sectional views illustrating a method for fabricating a resistor of a semiconductor device according to an embodiment of the present invention.

Figure 1A:
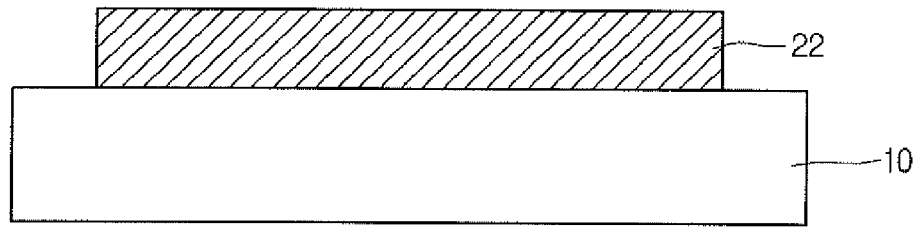
FIGS. 1A to 1E are sectional views illustrating a method for fabricating a resistor for a semiconductor device according to an embodiment of present invention.

Referring to FIG. 1A, a first polysilicon layer 22 can be deposited on a semiconductor substrate 10.

Figure 1B:
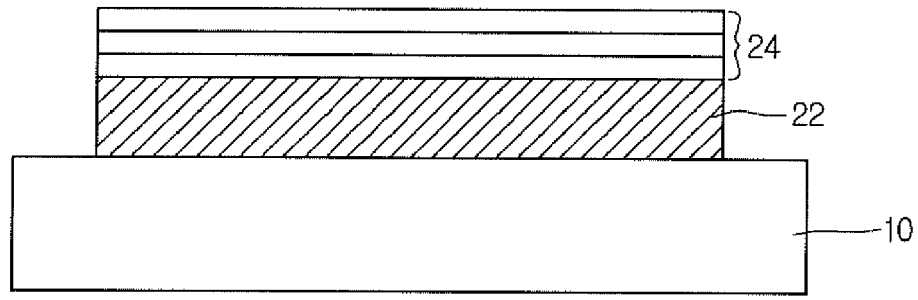

Referring to FIG. 1B, an insulating layer 24 can be deposited on the first polysilicon layer 22. In one embodiment, the insulating layer 24 can be an oxide-nitride-oxide (ONO) layer.

Figure 1C:
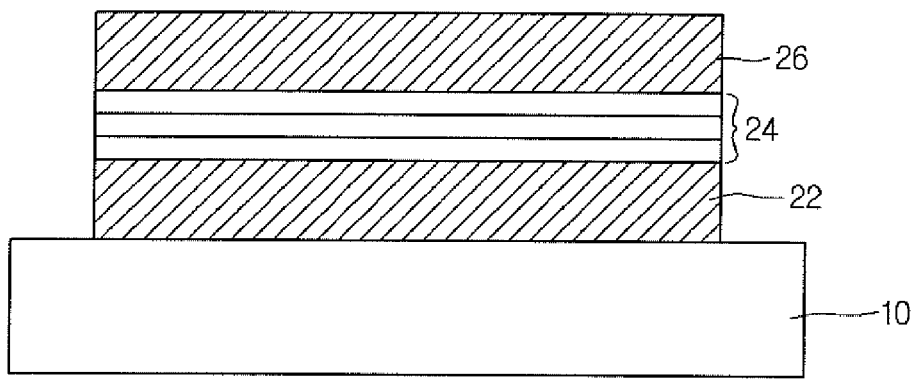

Referring to FIG. 1C, a second polysilicon layer 26 can be deposited on the insulating layer 24.

Figure 1D:
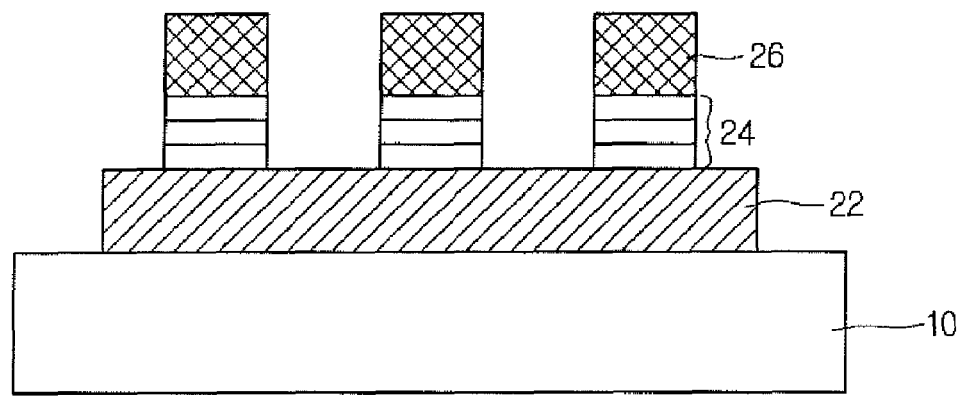

Referring to FIG. 1D, a photo resist mask formed on the second polysilicon layer 26 can be used to etch the second polysilicon layer 26 and the insulating layer 24 and form second polysilicon layer patterns.

By etching the second polysilicon layer 26 and the insulating layer 24, the first polysilicon layer 22 can be exposed.

Figure 1E:
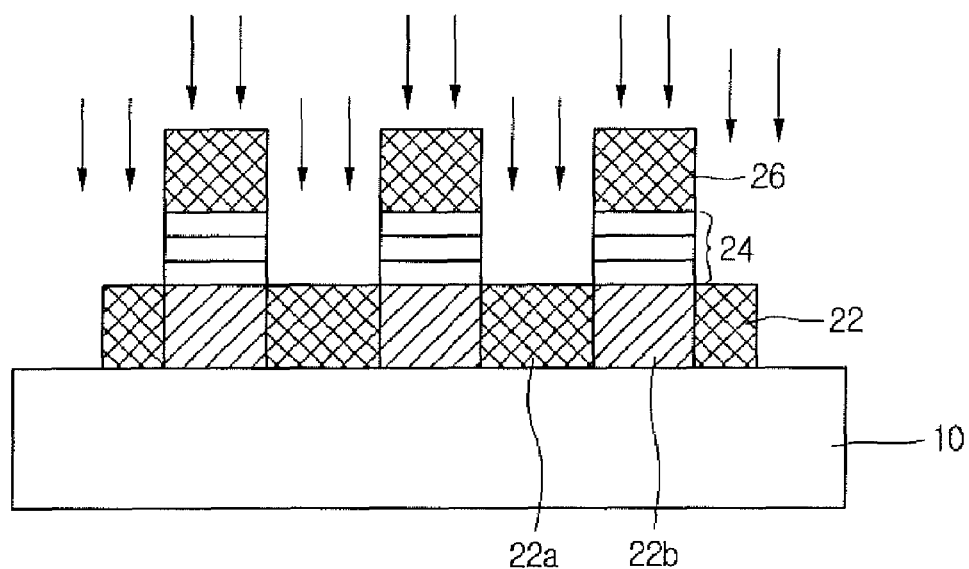

Referring to FIG. 1E, an ion implantation process can be performed on the entire semiconductor substrate 10 to increase a dopant concentration of the exposed first polysilicon layer 22 and the second polysilicon layer 26. In a specific embodiment, the dopant can be highly adjusted.

The second polysilicon layer 26 can be used as a mask for the first polysilicon layer 22 when the ion implantation process is performed. In one embodiment, ions are only implanted into the exposed portion of the first polysilicon layer 22a. Meanwhile, the ions are not implanted into the covered portion of the first polysilicon layer 22b.

Therefore, the exposed portion of the first polysilicon layer 22a in which the ions are implanted has a higher ion concentration than that of the covered portion of the first polysilicon layer 22b in which the ions are not implanted. Thus, current can flow through the first polysilicon layer 22a in which the ions are implanted.

In a further embodiment, the ions can be implanted into the exposed first polysilicon layer 22a and the second polysilicon layer 26 to complete a patterning process of resistors 26 and 22a using the polysilicon layers.

Resistor values using the polysilicon layers can be adjusted by the ion dose when the ion implantation process is performed.

Figure 2:
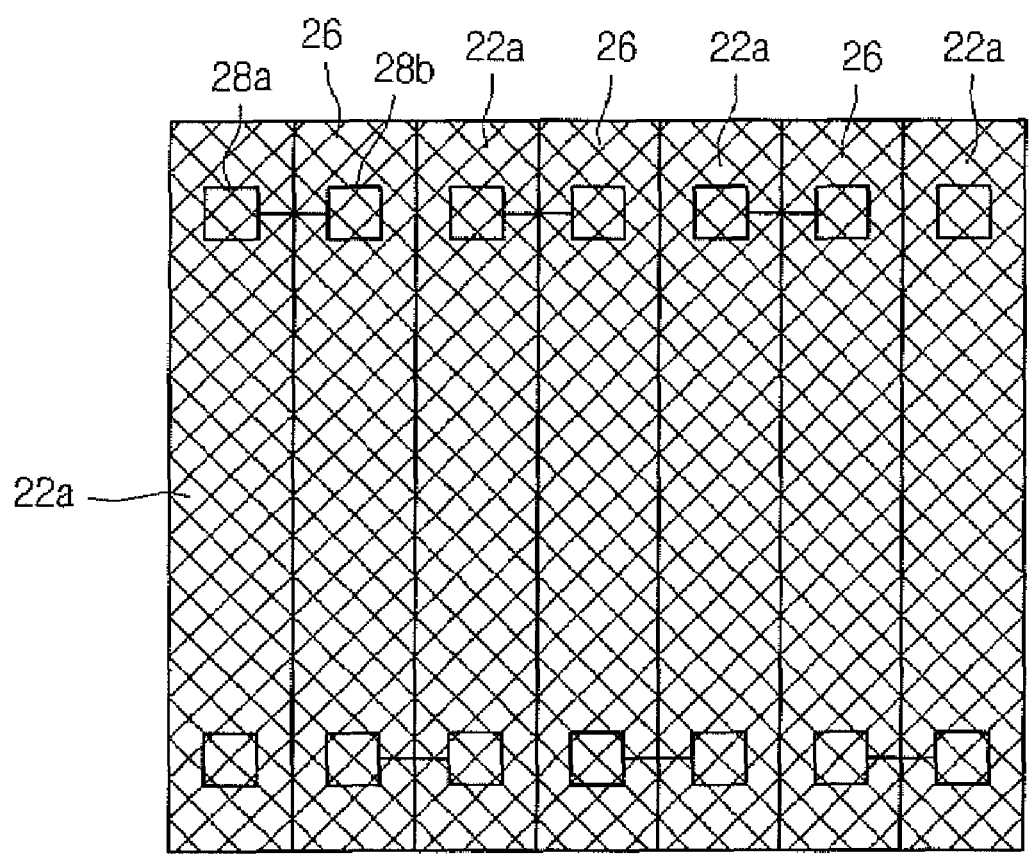
FIG. 2 is a plan view of a resistor for a semiconductor device according to an embodiment of the present invention.

Referring to FIG. 2, in a preferred embodiment, the subject resistor can incorporate a first resistor implemented by the ion implanted first polysilicon layer 22a and a second resistor implemented by the ion implanted second polysilicon layer 26.

The ion implanted first polysilicon layer 22a and second polysilicon layer 26 may be formed in a bar shape spaced at predetermined intervals. Thus, the resistors may be formed in a minimized size.

The ion implanted first polysilicon layer 22a and second polysilicon layer 26 can be arranged adjacent to each other at a step difference.

Referring to FIG. 2, the first polysilicon layer 22a and second polysilicon layer 26 can be connected in series using a first contact 28a and a second contact 28b.

The first contact 28a can be formed on an upper surface of the first polysilicon layer 22a and the second contact 28b can be formed on an upper surface of the second polysilicon layer 26.

Thus, embodiments of the subject resistor can incorporate a first resistor implemented by the first polysilicon layer 22a and a second resistor implemented by the second polysilicon layer 26, where the first resistor and second resistor are formed to be adjacent to each other at a step difference. Therefore, a space between the resistors can be reduced to decrease the size of the resistors.

According to embodiments of the present invention, a first resistor implemented by the first polysilicon layer 22a and a second resistor implemented by the second polysilicon layer 26 can be formed to be adjacent to each other such that the space between the resistors can be reduced to decrease the resistor pattern area, thereby preventing the size of a device from increasing.

I claim:

1. A method for fabricating a resistor of a semiconductor device, the method comprising:
   forming a first polysilicon layer, an insulating layer, and a second polysilicon layer on a semiconductor substrate;
   patterning the insulating layer and the second polysilicon layer to expose a first portion of the first polysilicon layer;
   implanting ions into the patterned second polysilicon layer and the first portion of the first polysilicon layer; and
   forming contacts on the first portion of the first polysilicon layer and the patterned second polysilicon layer.

2. The method of claim 1, wherein the insulating layer is an oxide-nitride-oxide (ONO) layer.

3. The method of claim 1, wherein patterning the insulating layer and the second polysilicon layer to expose a first portion of the first polysilicon layer, comprises:
   forming a plurality of second polysilicon patterns by removing a portion of the insulating layer and the second polysilicon layer.

4. The method of claim 1, wherein the ions are implanted into the first portion of the first polysilicon layer using the patterned second polysilicon layer as a mask.

5. The method of claim 1, wherein forming contacts on the first portion of the first polysilicon layer and the patterned second polysilicon layer, comprises:
   forming two contacts on the patterned second polysilicon layer to connect to regions of the first portion of the first polysilicon layer located at both sides thereof.

* * * * *